(12) United States Patent
Challa et al.

(10) Patent No.: US 8,756,477 B2
(45) Date of Patent: Jun. 17, 2014

(54) SYSTEM, METHOD AND APPARATUS FOR EARLY TERMINATION BASED ON TRANSPORT BLOCK FAIL FOR ACKNOWLEDGMENT BUNDLING IN TIME DIVISION DUPLEX

(75) Inventors: Raghu N Challa, San Diego, CA (US); Thomas B Wilborn, San Diego, CA (US); Supratik Bhattacharjee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 339 days.

(21) Appl. No.: 12/973,792

(22) Filed: Dec. 20, 2010

(65) Prior Publication Data
US 2011/0154170 A1    Jun. 23, 2011

Related U.S. Application Data

(60) Provisional application No. 61/288,795, filed on Dec. 21, 2009.

(51) Int. Cl.
*G06F 11/00* (2006.01)
(52) U.S. Cl.
USPC ............ 714/758; 714/776; 370/280; 370/242
(58) Field of Classification Search
None
See application file for complete search history.

(56) References Cited

U.S. PATENT DOCUMENTS

| 6,181,704 | B1 | 1/2001 | Drottar et al. |
| 7,983,330 | B2 * | 7/2011 | Kim et al. ...................... 375/220 |
| 8,072,911 | B2 * | 12/2011 | Astely et al. .................. 370/280 |
| 2006/0018259 | A1 | 1/2006 | Kadous |
| 2009/0279460 | A1 | 11/2009 | Sarkar |
| 2010/0309865 | A1 * | 12/2010 | Kimura ......................... 370/329 |

FOREIGN PATENT DOCUMENTS

| JP | 2008011460 A | 1/2008 |
| WO | WO2009137464 | 11/2009 |
| WO | WO-2009137646 A2 | 11/2009 |

OTHER PUBLICATIONS

International Search Report and Written Opinion—PCT/US2010/061637—ISA/EPO—Apr. 4, 2011.
Taiwan Search Report—TW099145018—TIPO—Feb. 28, 2013.

* cited by examiner

*Primary Examiner* — Christopher McCarthy (57) ABSTRACT

Methods, apparatus and articles of manufacture are disclosed that provide for early termination based on transport block fail for acknowledgement bundling in time division duplex. In one embodiment, a method for operating a communication device is provided. In this embodiment, the communication device decodes a downlink subframe that is part of a bundle of subframes. If it detects a CRC failure in the subframe, it inhibits decoding of at least one other subframe in the bundle if present and reports the failure to the sending node. This Abstract is provided for the sole purpose of complying with the Abstract requirement rules that allow a reader to quickly ascertain the disclosed subject matter. Therefore, it is to be understood that it should not be used to interpret or limit the scope or the meaning of the claims.

14 Claims, 5 Drawing Sheets

SYSTEM, METHOD AND APPARATUS FOR EARLY TERMINATION BASED ON TRANSPORT BLOCK FAIL FOR ACKNOWLEDGMENT BUNDLING IN TIME DIVISION DUPLEX

CROSS REFERENCE TO RELATED APPLICATIONS

The present application claims priority to U.S. Provisional Patent Application Ser. No. 61/288,795 entitled "Early Termination Based on Transport Block Fail for Acknowledgment Bundling in Time Division Duplex," filed Dec. 21, 2009, the entirety of which is hereby incorporated by reference.

FIELD

The present disclosure relates generally to communication systems, and more particularly to early termination based on transport block fail for acknowledgement bundling in time division duplex.

BACKGROUND

Wireless communication systems are widely deployed to provide various types of communication content such as voice, data, and so on. These systems may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, 3GPP Long Term Evolution (LTE) systems, and orthogonal frequency division multiple access (OFDMA) systems.

These multiple access technologies have been adopted in various telecommunication standards to provide a common protocol that enables different wireless devices to communicate on a municipal, national, regional, and even global level. An example of an emerging telecommunication standard is Long Term Evolution (LTE). LTE is a set of enhancements to the Universal Mobile Telecommunications System (UMTS) mobile standard promulgated by Third Generation Partnership Project (3GPP). It is designed to better support mobile broadband Internet access by improving spectral efficiency, lowering costs, improving services, making use of new spectrum, and better integration with other open standards using OFDMA on the downlink (DL), SC-FDMA on the uplink (UL), and multiple-input multiple-output (MIMO) antenna technology. However, as the demand for mobile broadband access continues to increase, there exists a need for further improvements in LTE technology. Preferably, these improvements should be applicable to other multi-access technologies and the telecommunication standards that employ these technologies.

Generally, a wireless multiple-access communication system can simultaneously support communication for multiple wireless terminals. Each terminal communicates with one or more base stations via transmissions on the forward and reverse links. The forward link (or downlink) refers to the communication link from the base stations to the terminals, and the reverse link (or uplink) refers to the communication link from the terminals to the base stations. This communication link may be established via a single-in-single-out, multiple-in-single-out or a multiple-in-multiple-out (MIMO) system.

A MIMO system employs multiple ($N_T$) transmit antennas and multiple ($N_R$) receive antennas for data transmission. A MIMO channel formed by the $N_T$ transmit and $N_R$ receive antennas may be decomposed into $N_S$ independent channels, which are also referred to as spatial channels, where $N_S \leq \min\{N_T, N_R\}$. Each of the $N_S$ independent channels corresponds to a dimension. The MIMO system can provide improved performance (e.g., higher throughput and/or greater reliability) if the additional dimensionalities created by the multiple transmit and receive antennas are utilized.

A MIMO system supports time division duplex (TDD) and frequency division duplex (FDD) systems. In a TDD system, the forward and reverse link transmissions are on the same frequency region so that the reciprocity principle allows the estimation of the forward link channel from the reverse link channel. This enables the access point to extract transmit beamforming gain on the forward link when multiple antennas are available at the access point.

SUMMARY

In various embodiments, a method, an apparatus, and a computer program product for wireless communication are provided in which, upon detection of a CRC failure of a received subframe, decoding of subsequent subframes is terminated and a single failure notification for the complete bundle is reported.

In one embodiment of a provided method a wireless communication device receives a set of bundled subframes. It decodes a subframe from the set and checks the CRC. If a failure has occurred it ceases the decoding process and notifies the sending node of the failure of the bundle of subframes via an uplink transmission. In another embodiment, upon receiving a retransmission, the device determines if a particular subframe of the bundle has been previously successfully received. If so the device skips the decoding process and moves to the next subframe in the bundle.

In other embodiments, a method, an apparatus, and a computer program product for wireless communication are provided in which, upon receiving a retransmission of a previously sent bundle, decoding of any previously successfully decoded subframes is bypassed and only the subframe for which a CRC error was reported and any subsequent subframes of the bundle are decoded.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout and wherein.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several embodiments of telecommunication systems will now be presented with reference to various apparatus and methods. These apparatus and methods will be described in the following detailed description and illustrated in the accompanying drawing by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium. A computer-readable medium may include, by way of example, a magnetic storage device (e.g., hard disk, floppy disk, magnetic strip), an optical disk (e.g., compact disk (CD), digital versatile disk (DVD)), a smart card, a flash memory device (e.g., card, stick, key drive), random access memory (RAM), read only memory (ROM), programmable ROM (PROM), erasable PROM (EPROM), electrically erasable PROM (EEPROM), a register, a removable disk, a carrier wave, a transmission line, and any other suitable medium for storing or transmitting software. The computer-readable medium may be resident in the processing system, external to the processing system, or distributed across multiple entities including the processing system. Computer-readable medium may be embodied in a computer-program product. By way of example, a computer-program product may include a computer-readable medium in packaging materials. Those skilled in the art will recognize how best to implement the described functionality presented throughout this disclosure depending on the particular application and the overall design constraints imposed on the overall system.

The techniques described herein may be used for various wireless communication networks such as Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Universal Terrestrial Radio Access (UTRA), cdma2000, etc. UTRA includes Wideband-CDMA (W-CDMA) and Low Chip Rate (LCR). cdma2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). Long Term Evolution (LTE) is an upcoming release of UMTS that uses E-UTRA. UTRA, E-UTRA, GSM, UMTS and LTE are described in documents from an organization named "3rd Generation Partnership Project" (3GPP). cdma2000 is described in documents from an organization named "3rd Generation Partnership Project 2" (3GPP2). These various radio technologies and standards are known in the art. For clarity, certain embodiments of the techniques are described below for LTE, and LTE terminology is used in much of the description below.

Single carrier frequency division multiple access (SC-FDMA), which utilizes single carrier modulation and frequency domain equalization is a multiple access technique. SC-FDMA has similar performance and essentially the same overall complexity as those of OFDMA system. SC-FDMA signal has lower peak-to-average power ratio (PAPR) because of its inherent single carrier structure. SC-FDMA has drawn great attention, especially in uplink communications where lower PAPR greatly benefits the mobile terminal in terms of transmit power efficiency. It is currently a working assumption for uplink multiple access scheme in 3GPP Long Term Evolution (LTE), or Evolved UTRA.

Figure 1:
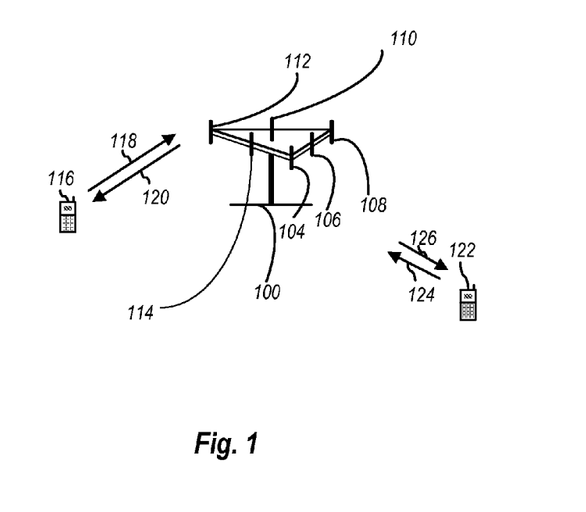
FIG. 1 illustrates a multiple access wireless communication system according to one embodiment.

Referring to FIG. 1, a multiple access wireless communication system according to one embodiment is illustrated. An access point 100 (AP) (e.g., base station, Evolved Node B (eNB, eNodeB, etc.)) includes multiple antenna groups, one including 104 and 106, another including 108 and 110, and an additional including 112 and 114. In FIG. 1, only two antennas are shown for each antenna group, however, more or fewer antennas may be utilized for each antenna group. Access terminal 116 (AT) is in communication with antennas 112 and 114, where antennas 112 and 114 transmit information to access terminal 116 over forward link 120 and receive information from access terminal 116 over reverse link 118. Access terminal 122 is in communication with antennas 104 and 106, where antennas 104 and 106 transmit information to access terminal 122 over forward link 126 and receive information from access terminal 122 over reverse link 124. In a FDD system, communication links 118, 120, 124 and 126 may use different frequencies for communication. For example, forward link 120 may use a different frequency then that used by reverse link 118.

Each group of antennas and/or the area in which they are designed to communicate is often referred to as a sector of the access point. In the embodiment, antenna groups each are designed to communicate to access terminals in a sector of the areas covered by access point 100.

In communication over forward links 120 and 126, the transmitting antennas of access point 100 may utilize beamforming in order to improve the signal-to-noise ratio of forward links for the different access terminals 116 and 122. Also, an access point using beamforming to transmit to access terminals scattered randomly through its intended coverage area causes less interference to access terminals in neighboring sectors than an access point transmitting through a single antenna uniformly to all its access terminals.

An access point may be a fixed station used for communicating with the terminals and may also be referred to as an access point, a Node B, an Evolved Node B (eNB), or some other terminology. An access terminal may also be called an access terminal, user equipment (UE), a wireless communication device, terminal, access terminal or some other terminology.

Figure 2:
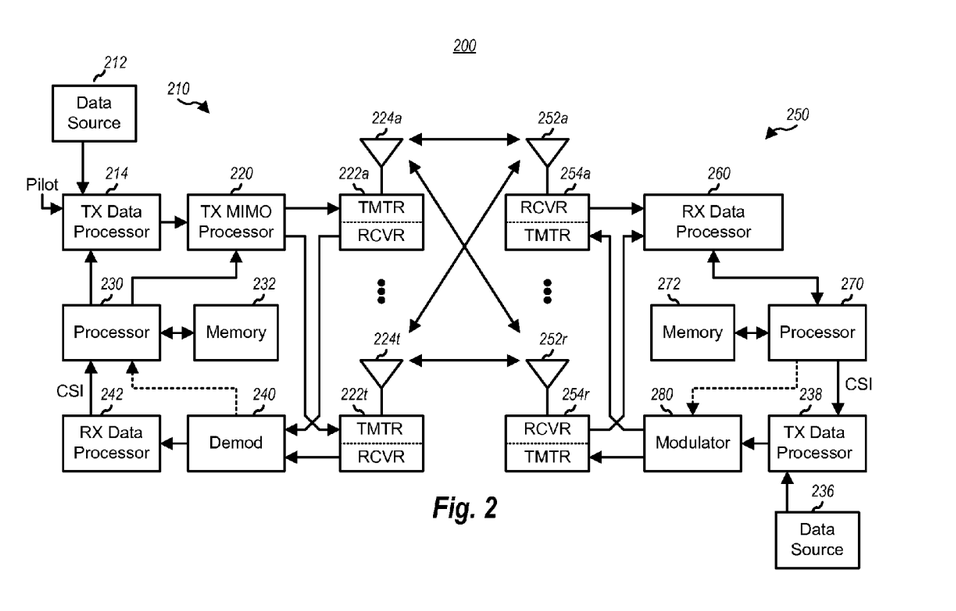
FIG. 2 illustrates a block diagram of a communication system.

FIG. 2 is a block diagram 200 of an eNB 210 in communication with a UE 250 in an access network. In the DL, upper layer packets from the core network are provided to a transmit (TX) processor 214. The TX processor 214 implements the functionality of the L1, L2, and L3 layers. With respect to L2 layer functionality, the TX processor 214 compresses the headers of the upper layer packets, ciphers the packets, segments the ciphered packets, reorders the segmented packets, multiplexes the data packets between logical and transport channels, and allocates radio resources to the UE 250 based on various priority metrics. The TX processor 214 is also responsible for ARQ or HARQ operations, retransmission of lost packets, and signaling to the UE 250 based on controls from the L3 layer.

With respect to L1 layer functionality, the TX processor 214 implements various signal processing functions for the physical layer. The signal processing functions includes coding and interleaving to facilitate forward error correction (FEC) at the UE 250 and mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols are then split into parallel streams. Each stream is then mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator may be used to determine the coding and modulation scheme, as well as for spatial processing. The channel estimate may be derived from a reference signal and/or channel condition feedback transmitted by the UE 250. Each spatial stream is then provided to a different antenna 224 via a separate transmitter 222. Each transmitter 222aTX modulates an RF carrier with a respective spatial stream for transmission.

At the UE 250, each receiver 254 receives a signal through its respective antenna 252. Each receiver 254 recovers information modulated onto an RF carrier and provides the information to the receiver (RX) processor 260.

The RX processor 260 implements various signal processing functions of the L1, L2, and L3 layers. With respect to the L1 layer functionality, the RX processor 260 performs spatial processing on the information to recover any spatial streams destined for the UE 250. If multiple spatial streams are destined for the UE 250, they may be combined by the RX processor 260 into a single OFDM symbol stream. The RX processor 260 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, is recovered and demodulated by determining the most likely signal constellation points transmitted by the eNB 210. These soft decisions may be based on channel estimates computed by the channel estimator. The soft decisions are then decoded and deinterleaved to recover the data and control signals that were originally transmitted by the eNB 210 on the physical channel. The data and control signals are then provided to the L2 layer.

With respect to the L2 layer functionality, the RX processor 260 provides demultiplexing between transport and logical channels, reassembles the data packets into upper layer packets, deciphers the upper layer packets, decompresses the headers and processes the control signals. The upper layer packets are then provided to a data sink (not shown), which represents all the protocol layers above the L2 layer. The RX processor 260 is also responsible for error detection using an acknowledgement (ACK) and/or negative acknowledgement (NACK) protocol to support ARQ or HARQ operations. The control signals are provided to the L3 layer.

In the UL, a data source 236 is used to provide data packets to a transmit (TX) processor 238. The data source represents all protocol layers above the L2 layer (L2). Similar to the functionality described in connection with the DL transmission by the eNB 210, the TX processor 238 implements the L1, L2, and L3 layers for the user plane and the control plane. Channel estimates derived by a channel estimator from a reference signal or feedback transmitted by the eNB 210 may be used by the TX processor 238 to select the appropriate coding and modulation schemes, and to facilitate spatial processing. The spatial streams generated by the TX processor 238 are provided to different antenna 252 via separate transmitters 254. Each transmitter 254 modulates an RF carrier with a respective spatial stream for transmission.

The receiver function is processed at the eNB 210 in a manner similar to that described in connection with the transmitter function at the eNB 210. Each receiver 222 receives a signal through its respective antenna 224. Each receiver 222 recovers information modulated onto an RF carrier and provides the information to a RX processor 242. The RX processor 242 implements the L1, L2, and L3 layers. Upper layer packets from the RX processor may be provided to the core network and control signals may be provided to the L3 layer.

The eNB 210 may have multiple antennas supporting MIMO technology. The use of MIMO technology enables the eNB 210 to exploit the spatial domain to support spatial multiplexing, beamforming, and transmit diversity.

Spatial multiplexing may be used to transmit different streams of data simultaneously on the same frequency. The data steams may be transmitted to a single UE 250 to increase the data rate or to multiple UEs 250 to increase the overall system capacity. This is achieved by spatially precoding each data stream and then transmitting each spatially precoded stream through a different transmit antenna on the downlink. The spatially precoded data streams arrive at the UE(s) 250 with different spatial signatures, which enables each of the UEs 250 to recover the one or more the data streams destined for that UE 250. On the uplink, each UE 250 transmits a spatially precoded data stream, which enables the eNB 210 to identify the source of each spatially precoded data stream.

Spatial multiplexing is generally used when channel conditions are good. When channel conditions are less favorable, beamforming may be used to focus the transmission energy in one or more directions. This may be achieved by spatially precoding the data for transmission through multiple antennas. To achieve good coverage at the edges of the cell, a single stream beamforming transmission may be used in combination with transmit diversity.

In the detailed description that follows, various aspects of an access network will be described with reference to a MIMO system supporting OFDM on the downlink. OFDM is a spread-spectrum technique that modulates data over a number of subcarriers within an OFDM symbol. The subcarriers are spaced apart at precise frequencies. The spacing provides "orthogonality" that enables a receiver to recover the data from the subcarriers. In the time domain, a guard interval (e.g., cyclic prefix) may be added to each OFDM symbol to combat inter-OFDM symbol interference. The uplink may use SC-FDMA in the form of a DFT-spread OFDM signal to compensate for high peak-to-average power ratio (PAPR).

In an embodiment, each data stream is transmitted over a respective transmit antenna. At eNB 210, traffic data for a number of data streams is provided from a data source 212 to TX data processor 214. TX data processor 214 formats, codes, and interleaves the traffic data for each data stream based on a particular coding scheme selected for that data stream to provide coded data.

The coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (i.e., symbol mapped) based on a particular modulation scheme (e.g., BPSK, QSPK, M-PSK, or M-QAM) selected for that data stream to provide modulation symbols. The data rate, coding, and modulation for each data stream may be determined by instructions performed by processor 230.

The modulation symbols for all data streams are then provided to a TX MIMO processor 220, which may further process the modulation symbols (e.g., for OFDM). TX MIMO processor 220 then provides $N_T$ modulation symbol streams to $N_T$ transmitters (TMTR) 222a through 222t. In certain embodiments, TX MIMO processor 220 applies beamforming weights to the symbols of the data streams and to the antenna from which the symbol is being transmitted.

Each transmitter 222 receives and processes a respective symbol stream to provide one or more analog signals, and further conditions (e.g., amplifies, filters, and upconverts) the analog signals to provide a modulated signal suitable for transmission over the MIMO channel. $N_T$ modulated signals from transmitters 222a through 222t are then transmitted from $N_T$ antennas 224a through 224t, respectively.

At UE 250, the transmitted modulated signals are received by $N_R$ antennas 252a through 252r and the received signal from each antenna 252 is provided to a respective receiver (RCVR) 254a through 254r. Each receiver 254 conditions (e.g., filters, amplifies, and downconverts) a respective received signal, digitizes the conditioned signal to provide samples, and further processes the samples to provide a corresponding "received" symbol stream.

An RX data processor 260 then receives and processes the $N_R$ received symbol streams from $N_R$ receivers 254 based on a particular receiver processing technique to provide $N_T$ "detected" symbol streams. The RX data processor 260 then demodulates, deinterleaves, and decodes each detected symbol stream to recover the traffic data for the data stream. The processing by RX data processor 260 is complementary to that performed by TX MIMO processor 220 and TX data processor 214 at eNB 210.

Processor 230 and processor 270 may direct operations at their respective systems. Additionally, a memory 232 at eNB 210 and a memory 272 at UE 250 can provide storage for program codes and data used by the processor 230 and the processor 270, respectively. The processor 270 periodically may determine which pre-coding matrix to use. Processor 270 may formulate a reverse link message comprising a matrix index portion and a rank value portion.

The reverse link message may comprise various types of information regarding the communication link and/or the received data stream. The reverse link message is then processed by a TX data processor 238, which also receives traffic data for a number of data streams from a data source 236, modulated by a modulator 280, conditioned by transmitters 254a through 254r, and transmitted back to eNB 210.

At eNB 210, the modulated signals from UE 250 are received by antennas 224, conditioned by receivers 222, demodulated by a demodulator 240, and processed by a RX data processor 242 to extract the reverse link message transmitted by the receiver system 250. Processor 230 then determines which pre-coding matrix to use for determining the beamforming weights then processes the extracted message.

In an embodiment, logical channels are classified into Control Channels and Traffic Channels. Logical Control Channels comprises Broadcast Control Channel (BCCH), which is DL channel for broadcasting system control information; Paging Control Channel (PCCH), which is DL channel that transfers paging information; Multicast Control Channel (MCCH), which is Point-to-multipoint DL channel used for transmitting Multimedia Broadcast and Multicast Service (MBMS) scheduling and control information for one or several Multicast Traffic Channels (MTCH's). Generally, after establishing RRC connection this channel is only used by UEs that receive MBMS. Dedicated Control Channel (DCCH) is Point-to-point bi-directional channel that transmits dedicated control information and used by UEs having an RRC connection. In one embodiment, Logical Traffic Channels comprise a Dedicated Traffic Channel (DTCH), which is point-to-point bi-directional channel, dedicated to one UE, for the transfer of user information, and a Multicast Traffic Channel (MTCH) for point-to-multipoint DL channel for transmitting traffic data.

In an embodiment, Transport Channels are classified into downlink (DL) and Uplink (UL). DL Transport Channels comprises a Broadcast Channel (BCH), Downlink Shared Data Channel (DL-SDCH), and a Paging Channel (PCH). The PCH for support of UE power saving (DRX cycle is indicated by the network to the UE) broadcasts over the entire cell and is mapped to PHY resources that can be used for other control/traffic channels. The UL Transport Channels comprises a Random Access Channel (RACH), a Request Channel (REQCH), a Uplink Shared Data Channel (UL-SDCH), and a plurality of PHY channels. The PHY channels comprise a set of DL channels and UL channels.

The DL PHY channels comprise:
Common Pilot Channel (CPICH)
Synchronization Channel (SCH)
Common Control Channel (CCCH)
Shared DL Control Channel (SDCCH)
Multicast Control Channel (MCCH)
Shared UL Assignment Channel (SUACH)
Acknowledgement Channel (ACKCH)
DL Physical Shared Data Channel (DL-PSDCH)
UL Power Control Channel (UPCCH)
Paging Indicator Channel (PICH)
Load Indicator Channel (LICH)

The UL PHY Channels comprise:
Physical Random Access Channel (PRACH)
Channel Quality Indicator Channel (CQICH)
Acknowledgement Channel (ACKCH)
Antenna Subset Indicator Channel (ASICH)
Shared Request Channel (SREQCH)
UL Physical Shared Data Channel (UL-PSDCH)
Broadband Pilot Channel (BPICH)

In an embodiment, a channel structure is provided that preserves the low PAPR properties of a single carrier waveform.

Figure 3:
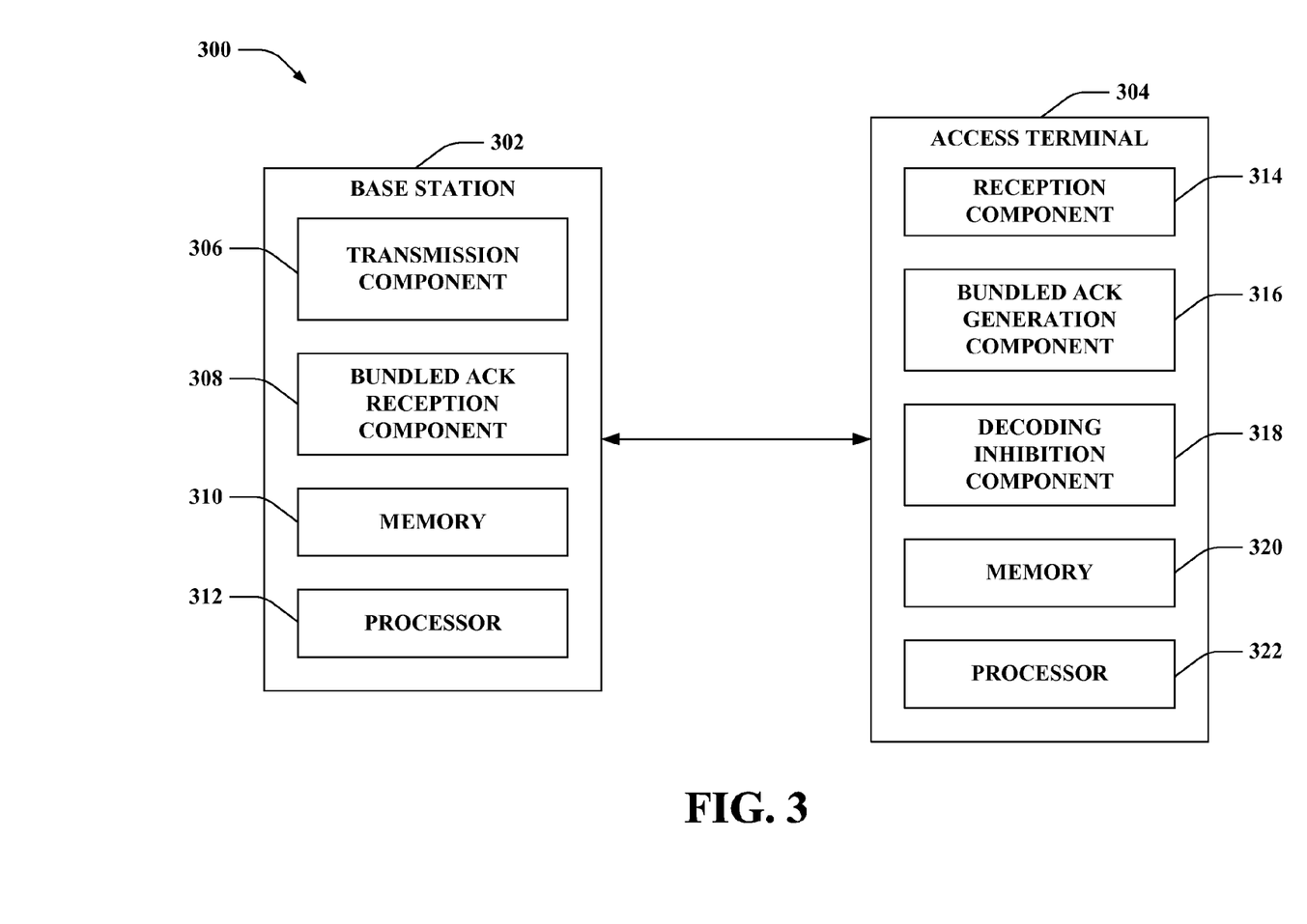
FIG. 3 illustrates an example system that supports disabling decoding of downlink subframes in a wireless communication environment.

For the purposes of the present document, the following abbreviations apply:
AM Acknowledged Mode
AMD Acknowledged Mode Data
ARQ Automatic Repeat Request
BCCH Broadcast Control CHannel
BCH Broadcast CHannel
C- Control-
CCCH Common Control CHannel
CCH Control CHannel
CCTrCH Coded Composite Transport Channel
CP Cyclic Prefix
CRC Cyclic Redundancy Check
CTCH Common Traffic CHannel
DCCH Dedicated Control CHannel
DCH Dedicated CHannel
DL DownLink
DSCH Downlink Shared CHannel
DTCH Dedicated Traffic CHannel
FACH Forward link Access CHannel
FDD Frequency Division Duplex
HARQ Hybrid Automatic Repeat Request
L1 Layer 1 (physical layer)
L2 Layer 2 (data link layer)
L3 Layer 3 (network layer)
LI Length Indicator
LSB Least Significant Bit
MAC Medium Access Control
MBMS Multimedia Broadcast Multicast Service
MCCH MBMS point-to-multipoint Control CHannel
MRW Move Receiving Window
MSB Most Significant Bit
MSCH MBMS point-to-multipoint Scheduling CHannel
MTCH MBMS point-to-multipoint Traffic CHannel
PAPR Peak-to-Average Power Ratio
PCCH Paging Control CHannel
PCH Paging CHannel
PDU Protocol Data Unit
PHY PHYsical layer
PhyCH Physical CHannels
RACH Random Access CHannel
RLC Radio Link Control
RRC Radio Resource Control
SAP Service Access Point
SDU Service Data Unit
SHCCH SHared channel Control CHannel
SN Sequence Number
SUFI SUper FIeld
TCH Traffic CHannel
TDD Time Division Duplex
TFI Transport Format Indicator
TM Transparent Mode
TMD Transparent Mode Data
TTI Transmission Time Interval
U- User-
UE User Equipment
UL UpLink
UM Unacknowledged Mode
UMD Unacknowledged Mode Data
UMTS Universal Mobile Telecommunications System
UTRA UMTS Terrestrial Radio Access
UTRAN UMTS Terrestrial Radio Access Network
MBSFN multicast broadcast single frequency network
MCE MBMS coordinating entity
MCH multicast channel
DL-SCH downlink shared channel
MSCH MBMS control channel
PDCCH physical downlink control channel
PDSCH physical downlink shared channel FIG. 3 illustrates an example system 300 that supports disabling the decoding of downlink subframes in a wireless communication environment. System 300 includes a base station 302 that can transmit and/or receive information, signals, data, instructions, commands, bits, symbols, and the like. Base station 302 can communicate with an access terminal 304 via a forward link and/or reverse link. Access terminal 304 can transmit and/or receive information, signals, data, instructions, commands, bits, symbols, and the like. Moreover, although not shown, it is contemplated that any number of base stations similar to base station 302 can be included in system 300 and/or any number of access terminals similar to access terminal 304 can be included in system 300.

Base station 302 can include a transmission component 306, a bundled acknowledgment (ACK) reception component 308, a memory 310, and a processor 312. Transmission component 306 can send a downlink transmission to access terminal 304. For instance, system 300 can support a time division duplex (TDD) mode (e.g., Long Term Evolution (LTE) TDD mode, etc.). As such, multiple subframes of a radio frame can be utilized for downlink transmission (e.g., by transmission component 306). Further, the multiple subframes utilized for downlink transmission (or a subset thereof) can be associated with a single subframe of the radio frame employed for uplink transmission in some TDD configurations. Accordingly, multiple Cyclic Redundancy Check (CRC) statuses corresponding to the multiple subframes utilized for downlink transmission can be obtained by bundled ACK reception component 308 in the single subframe employed for uplink transmission.

Moreover, access terminal 304 can include a reception component 314, a bundled ACK generation component 316, a decoding inhibition component 318, a memory 320, and a processor 322. Reception component 314 can obtain the downlink transmission sent by base station 302 (e.g., via transmission component 306). Further, reception component 314 can process the obtained downlink transmission. For example, processing effectuated by reception component 314 can include buffering, filtering, correcting the obtained downlink transmission (e.g., offset correction, IQ correction, frequency correction, etc.), controlling digital gain, sampling utilizing Fast Fourier Transforms (FFTs), estimating a channel, demodulating (e.g., using channel interpolation, Maximum Ratio Combining/Minimum Mean Square Error (MRC/MMSE) operations, etc.), demapping (e.g., by calculating log-likelihood ratios (LLRs), etc.), decoding (e.g., utilizing a Turbo Decoder, etc.), evaluating a CRC status, and the like. It is contemplated, however, that all of the aforementioned processing need not be effectuated by reception component 314 (and/or disparate component(s) (not shown)). Further, it is to be appreciated that additional processing that is known in the art, and other than the processing expressly described herein, can be performed upon the obtained downlink transmission by reception component 314 (and/or disparate component(s)

(not shown)), and any such further processing is intended to fall within the scope of the hereto appended claims.

According to an illustration, reception component 314 can evaluate CRC statuses of obtained downlink transmissions. Further, bundled ACK generation component 316 can combine CRC statuses from downlink transmissions sent during a plurality of subframes. The combined CRC statuses can be bundled together for transmission via a single uplink subframe. For instance, bundled ACK generation component 316 can logically "AND" CRC statuses across downlink subframes in a bundling window associated with an uplink. Further, bundled ACK generation component 316 can send a single acknowledgment/negative acknowledgment (ACK/NACK) status over the uplink (e.g., which can be received by bundled ACK reception component 308 of base station 302). This reduction in transmitted information can be used to provide power savings at a transceiver (e.g., access terminal 304).

When ACKs and NACKs are combined by bundled ACK generation component 316 via ANDing, a single CRC fail as identified by reception component 314 among all downlink subframes results in bundled ACK generation component 316 sending a NACK (e.g., reporting a failure). Immediately upon detecting a CRC failure within a bundle, decoding inhibition component 318 can disable decoding (e.g., performed by reception component 314) of subsequent downlink subframes in the bundle. Thus, halting decoding for the subsequent downlink subframes can lead to power savings at a receiver (e.g., access terminal 304).

Memory 310 and memory 320 can store data to be transmitted, received data, and any other suitable information related to performing the various actions and functions set forth herein. It will be appreciated that the data storage (e.g., memory 310, memory 320, etc.) described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable PROM (EEPROM), or flash memory. Volatile memory can include random access memory (RAM), which can act as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Memory 310 and memory 320 of the subject systems and methods is intended to comprise, without being limited to, these and any other suitable types of memory, either known or as yet to be developed. Moreover, memory 310 can be operatively coupled to processor 312 and/or memory 320 can be operatively coupled to processor 322.

Moreover, termination of decoding as described herein can be generally applicable for LTE frequency division duplex (FDD) or any other technique in which CRC information from multiple code words can be collapsed into a single response (e.g., as yielded by bundled ACK generation component 316, etc.). Similar to the foregoing, decoding can be disabled (e.g., by decoding inhibition component 318, etc.) after a first CRC failure.

Figure 4:
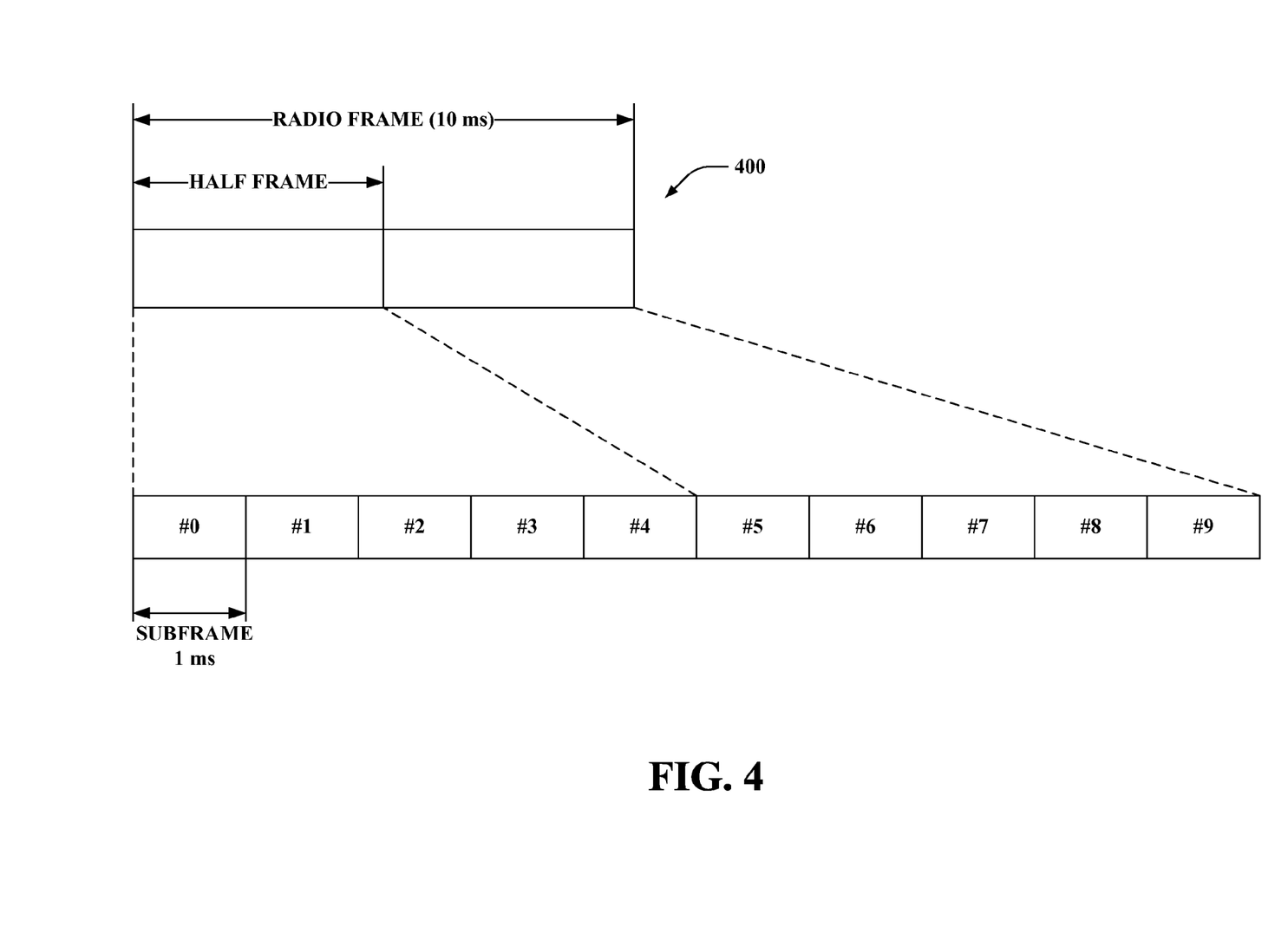
FIG. 4 illustrates an example radio frame that can be utilized in connection with the claimed subject matter.

Turning to FIG. 4, illustrated is an exemplary radio frame 400 that can be utilized in connection with the claimed subject matter. Radio frame 400 can be 10 ms in duration and can include 10 subframes. Further, a subframe can be 1 ms in duration.

Radio frame 400 can be used for LTE TDD, for instance. Accordingly, various TDD configurations can be implemented. Each TDD configuration can include a corresponding pattern of uplink and downlink subframes. Thus, dependent upon the TDD configuration, each subframe can be either an uplink subframe or a downlink subframe (or a special subframe that includes a downlink pilot time slot, a guard period, and an uplink pilot time slot). The TDD configuration that is utilized within a wireless communication environment can also allow for load balancing between uplink and downlink traffic.

According to exemplary illustration FIG. 4, eight of the subframes of radio frame 400 can be downlink subframes, one subframe of radio frame 400 can be an uplink subframe, and one subframe of radio frame 400 can be a special subframe (e.g., the TDD configuration can be associated with a pattern where subframe #0 is a downlink subframe, subframe #1 is a special subframe, subframe #2 is an uplink subframe, and subframes #3-#9 are each downlink subframes). By way of another example, six of the subframes of radio frame 400 can be downlink subframes, three subframes of radio frame 400 can be uplink subframes, and one subframe of radio frame 400 can be a special subframe (e.g., the TDD configuration can be associated with a pattern where subframe #0 is a downlink subframe, subframe #1 is a special subframe, subframes #2-#4 are each uplink subframes, and subframes #5-#9 are each downlink subframes). It is to be appreciated, however, that the claimed subject matter is not limited to the foregoing exemplary TDD configurations, as it is contemplated that any TDD configuration and associated pattern is intended to fall within the scope of the hereto appended claims.

Again, reference is made to FIG. 3. According to an example, system 300 can utilize a TDD configuration with a pattern that includes nine downlink subframes and one uplink subframe for a radio frame; yet, it is to be appreciated that the claimed subject matter is not limited to such example (e.g., different bundle sizes can be employed where any suitable number of downlink subframes can be bundled together as part of a report sent via one uplink subframe). Thus, reception component 314 can process the nine downlink subframes. Further, bundled ACK generation component 316 can combine ACKs and NACKs from the nine downlink subframes to yield one ACK/NACK bit for sending to base station 302. Bundled ACK generation component 316 can combine the ACKs and NACKs via ANDing such bits; hence, if at least one of the nine downlink subframes fails (e.g., CRC failure is detected by reception component 314), then bundled ACK generation component 316 can indicate to base station 302 that a failure occurred with the one ACK/NACK bit sent via the uplink subframe.

Following the above example, subframes #0-#8 can be downlink subframes and subframe #9 can be an uplink subframe; yet, it is to be appreciated that the claimed subject matter is not so limited. Reception component 314 can process the downlink subframes in sequence. Hence, downlink subframe #0 can be decoded and a corresponding ACK or NACK for downlink subframe #0 can be collected by reception component 314 (e.g., CRC pass or CRC failure), then downlink subframe #1 can be decoded and a corresponding ACK or NACK for downlink subframe #1 can be collected by reception component 314, and so forth. During the processing of the downlink subframes by reception component 314, if a failure (e.g., CRC failure) of a downlink subframe is detected, then bundled ACK generation component 316 can report a NACK for the one ACK/NACK bit sent via the uplink subframe regardless whether subsequent downlink subframe(s)

are successfully decoded or not. Thus, upon detecting a failure of a downlink subframe, decoding inhibition component 318 can disable further decoding of downlink subframe(s) (e.g., performed by reception component 314, Turbo Decoder, etc.) in the sequence after the downlink subframe that failed and before the uplink subframe in which the failure is reported by bundled ACK generation component 316, thereby resulting in a power savings at access terminal 304.

By way of illustration, when a failure is identified, decoding inhibition component 318 can stop decoding performed by reception component 314 on subsequent downlink subframes in a radio frame prior to an uplink subframe. However, other processing can still be effectuated upon such subsequent downlink subframes (e.g., IQ samples can be collected, channel estimation can be performed, demodulation can be effectuated using MRC or MMSE, LLR can be computed, combined in a buffer). Decoding alone can be inhibited since it can be an independent operation. Further, if nine subframes are used for downlink transmission in a radio frame and a failure is reported by bundled ACK generation component 316, the information sent during the nine subframes can be transmitted again by base station 302 (e.g., by transmission component 306 in response to identification of the failure by bundled ACK reception component 308, etc.) in a subsequent radio frame. Since reporting of the failure by bundled ACK generation component 316 is collapsed into one bit, even if eight of the nine downlink subframes are decoded correctly while the other downlink subframe failed to be decoded correctly, all nine downlink subframes are retransmitted.

When downlink subframes are retransmitted by base station 302 (e.g., by transmission component 306) in response to a reported failure, access terminal 304 (e.g., reception component 314) can either decode or skip decoding of downlink subframe(s) that were previously successfully decoded. Again, an example radio frame that utilizes a TDD configuration with a pattern where subframes #0-#8 can be downlink subframes and subframe #9 can be an uplink subframe is described below; however, the claimed subject matter is not limited to such TDD configuration. By way illustration, CRCs for downlink subframes #0-#3 can pass, while a CRC for downlink subframe #4 can fail. Accordingly, decoding inhibition component 318 can cause reception component 314 to skip decoding of downlink subframes #5-#8 (e.g., a Turbo Decoder of access terminal 304 can be powered off for downlink subframes #5-#8, etc.). Utilization of this approach can provide power savings associated with powering off the Turbo Decoder for downlink subframe(s) after detection of a CRC failure. Further, bundled ACK generation component 316 can report a failure by way of uplink subframe #9. According to one example, during a next radio frame when information is resent in response to the reported failure (e.g., information from downlink subframes #0-#8 is retransmitted), reception component 314 can begin processing from downlink subframe #0. By way of another example, during the next radio frame when information is resent in response to the reported failure (e.g., information from downlink subframes #0-#8 is retransmitted), reception component 314 can begin processing at the downlink subframe that previously failed the CRC (e.g., start processing downlink subframe #4, then continue to process downlink subframe #5 if downlink subframe #4 passes the CRC, and so forth). Accordingly, since downlink subframes #0-#3 passed the CRC upon being decoded when previously transmitted in the prior radio frame, reception component 314 need not process such downlink subframes again when utilizing this approach. Thus, processing by reception component 314 after channel estimation for downlink subframe(s) that previously passed CRC can be skipped, thereby yielding power savings (i.e., greater power savings can result).

Figure 5:
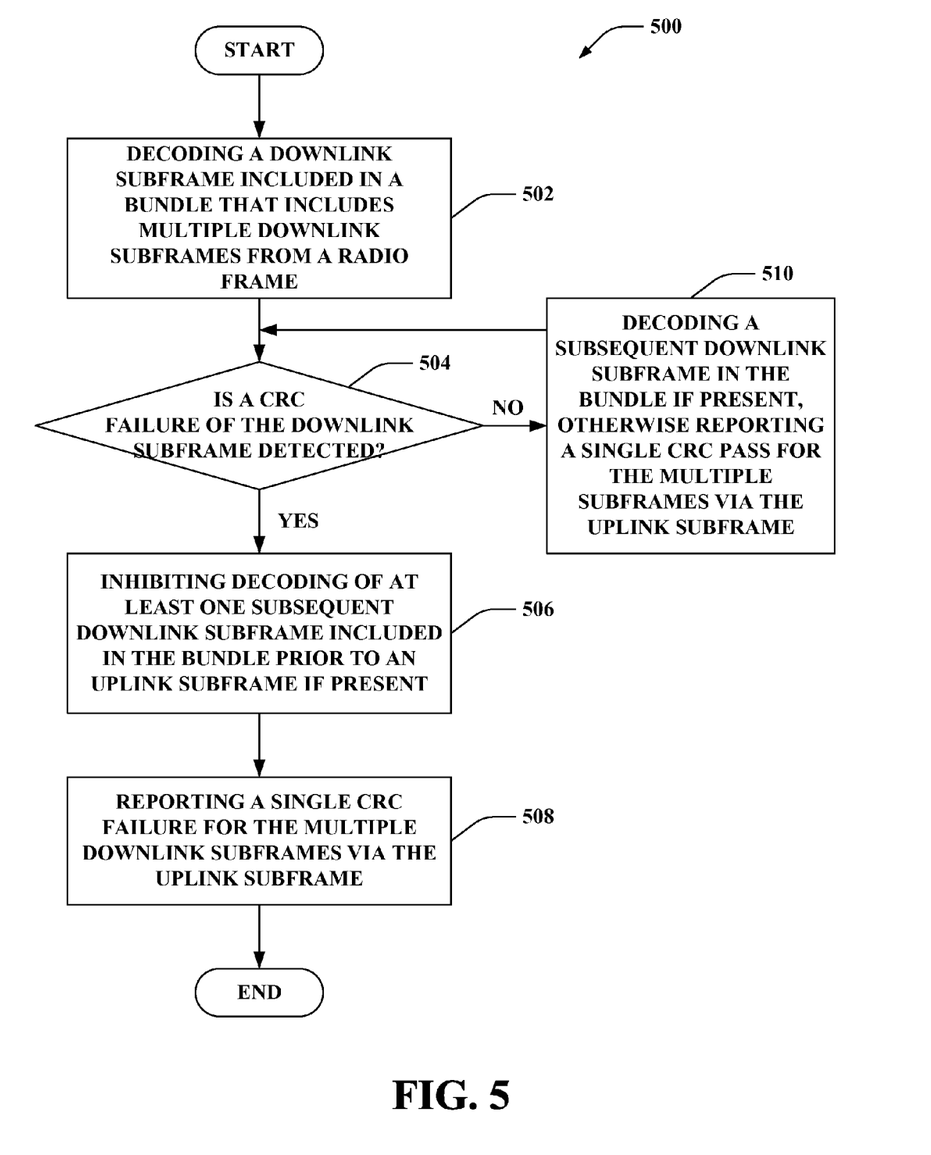
FIG. 5 illustrates an example methodology that facilitates terminating decoding of subsequent downlink subframe(s) in a bundle upon detecting a CRC failure in a wireless communication environment.

Referring to FIG. 5, a methodology relating to disabling decoding of downlink subframe(s) in a bundle in a wireless communication environment is illustrated. While, for purposes of simplicity of explanation, the methodology is shown and described as a series of acts, it is to be understood and appreciated that the methodology is not limited by the order of acts, as some acts can, in accordance with one or more embodiments, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more embodiments.

With reference to FIG. 5, illustrated therein is a methodology 500 that facilitates terminating decoding of subsequent downlink subframe(s) in a bundle upon detecting a CRC failure in a wireless communication environment. At 502, a downlink subframe included in a bundle that includes multiple downlink subframes contained within a radio frame can be decoded. The radio frame can support LTE TDD, for example. Moreover, a pattern of uplink subframe(s) and downlink subframe(s) based on a TDD configuration can be utilized with the radio frame. Further, the multiple downlink subframes can be associated with one uplink subframe as part of the bundle. At 504, a determination can be effectuated concerning whether a CRC failure of the downlink subframe is detected. If a CRC failure is detected, then methodology 500 continues to 506.

At 506, decoding of at least one subsequent downlink subframe included in the bundle prior to an uplink subframe can be inhibited if present. Rather, the at least one subsequent downlink subframe can be processed (e.g., IQ samples can be collected, channel estimation can be performed, demodulation can be effectuated, LLR can be calculated) without being decoded (e.g., a Turbo Decoder can be powered off, etc). At 508, a single CRC failure for the multiple downlink subframes can be reported via the uplink subframe. For instance, CRC statuses of each of the multiple downlink subframes can be ANDed to yield a single CRC failure. When the single CRC failure is reported, the multiple downlink subframes included in the bundle can be retransmitted (e.g., a retransmission of the bundle can be responsive to the single CRC failure, etc.). According to one example, decoding of a retransmission of the bundle can begin at a first downlink subframe from the multiple downlink subframes. By way of another example, decoding of the retransmission of the bundle can begin at a downlink subframe from the multiple downlink subframes detected to have previously failed the CRC; thus, successfully decoded downlink subframe(s) need not be decoded again.

If a CRC failure is not detected at 504, then methodology 500 continues to 510. At 510, a subsequent downlink subframe in the bundle can be decoded if present. Moreover, methodology 500 can continue to 504 to evaluate whether a CRC failure of the subsequent downlink subframe is detected. Otherwise, if the bundle does not include a subsequent downlink subframe prior to the uplink subframe (e.g., a subsequent downlink subframe in the bundle is lacking), then a single CRC pass can be reported for the multiple subframes via the uplink subframe.

Figure 6:
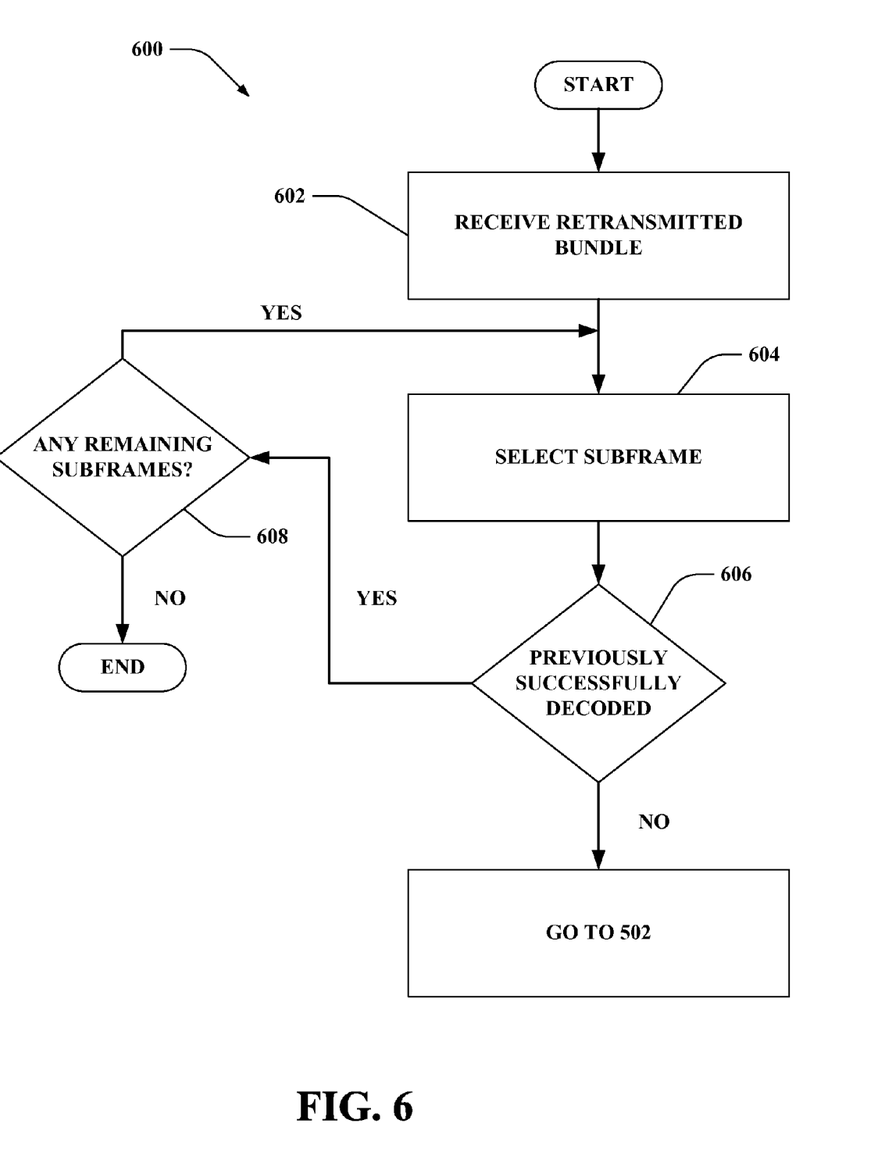
FIG. 6 illustrates an example methodology that facilitates receiving a retransmitted bundle and bypassing previously successfully decoded subframes.

With reference to FIG. 6, illustrated therein is a methodology 500 that facilitates decoding of a retransmitted bundle of subframes. Upon receiving by an eNB of a notice of a reception error from a UE, the eNB retransmits the entire bundle. Upon receiving the retransmitted bundle at 602, the UE selects a subframe from the bundle at 604. UE then determines whether that particular subframe is among those previously successfully decoded (e.g., whether there was no CRC error for that subframe at 606. If the subframe was previously successfully decoded, then the UE determines if there is any remaining subframe in the bundle at 608. If there is, then the method returns to 604 and if not, the method ends. If at 606 it is determined that the current subframe is not among those successfully decoded, the method goes to 502 of FIG. 5.

It will be appreciated that, in accordance with one or more embodiments described herein, inferences can be made pertaining to inhibiting decoding of downlink subframe(s). As used herein, the term "infer" or "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

It is understood that the specific order or hierarchy of steps in the processes disclosed is an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user equipment. In the alternative, the processor and the storage medium may reside as discrete components in a user equipment.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. An apparatus operable in a wireless communication system, the apparatus comprising:
    means for decoding a current downlink subframe included in a bundle that includes multiple downlink subframes;
    means for detecting a Cyclic Redundancy Check (CRC) failure of the current downlink subframe during the decoding of the current downlink subframe, the CRC failure indicating an error in the current downlink subframe;
    means for inhibiting decoding of subsequent downlink subframes in the bundle when the CRC failure is detected, the subsequent downlink subframes being subsequent to the current downlink subframe and prior to an uplink subframe of the bundle;
    means for reporting a single CRC failure for the multiple downlink subframes via the uplink subframe; and
    means for decoding a retransmission of the bundle beginning at a downlink subframe that previously failed the CRC, the retransmitted bundle being received in response to reporting of the single CRC failure.

2. The apparatus of claim 1, further comprising means for decoding a downlink subframe subsequent to the current downlink subframe upon detecting that the CRC of the current downlink subframe passed.

3. The apparatus of claim 1, further comprising means for reporting a single CRC pass for the multiple downlink subframes via the uplink subframe upon detecting that the CRC of the current downlink subframe passed and the current downlink subframe is the last downlink subframe of the bundle.

4. A method used in a wireless communication system, the method comprising:
  decoding a current downlink subframe included in a bundle that includes multiple downlink subframes;
  detecting a Cyclic Redundancy Check (CRC) failure of the current downlink subframe during the decoding of the current downlink subframe, the CRC failure indicating an error in the current downlink subframe;
  inhibiting decoding of subsequent downlink subframes in the bundle when the CRC failure is detected, the subsequent downlink subframes being subsequent to the current downlink subframe and prior to an uplink subframe of the bundle;
  reporting a single CRC failure for the multiple downlink subframes via the uplink subframe; and
  decoding a retransmission of the bundle beginning at a downlink subframe that previously failed the CRC, the retransmitted bundle being received in response to reporting of the single CRC failure.

5. The method of claim 4, further comprising determining if the current downlink subframe has been previously successfully decoded.

6. The method of claim 4, further comprising decoding a downlink subframe subsequent to the current downlink subframe upon detecting that the CRC of the current downlink subframe passed.

7. The method of claim 4, further comprising reporting a single CRC pass for the multiple downlink subframes via the uplink subframe upon detecting that the CRC of the current downlink subframe passed and the current downlink subframe is the last downlink subframe of the bundle.

8. An electronic device configured to execute the method of claim 4.

9. A computer program product for wireless communications, the computer program product comprising:
  a non-transitory computer-readable medium having program code recorded thereon, the program code comprising:
    program code to decode a current downlink subframe included in a bundle that includes multiple downlink subframes;
    program code to detect a Cyclic Redundancy Check (CRC) failure of the current downlink subframe during the decoding of the current downlink subframe, the CRC failure indicating an error in the current downlink subframe;
    program code to inhibit decoding of subsequent downlink subframes in the bundle when the CRC failure is detected, the subsequent downlink subframes being subsequent to the current downlink subframe and prior to an uplink subframe of the bundle;
    program code to report a single CRC failure for the multiple downlink subframes via the uplink subframe; and
    program code to decode a retransmission of the bundle beginning at a downlink subframe that previously failed the CRC, the retransmitted bundle being received in response to reporting of the single CRC failure.

10. The computer program product of claim 9, further comprising program code to decode a downlink subframe subsequent to the current downlink subframe upon detecting that the CRC of the current downlink subframe passed.

11. The computer program product of claim 9, further comprising program code to report a single CRC pass for the multiple downlink subframes via the uplink subframe upon detecting that the CRC of the current downlink subframe passed and the current downlink subframe is the last downlink subframe of the bundle.

12. An apparatus operable in a wireless communication system, the apparatus comprising:
  a memory unit; and
  at least one processor coupled to the memory unit, the at least one processor configured:
    to decode a current downlink subframe included in a bundle that includes multiple downlink subframes,
    to detect a Cyclic Redundancy Check (CRC) failure of the current downlink subframe during the decoding of the current downlink subframe, the CRC failure indicating an error in the current downlink subframe,
    to inhibit decoding of subsequent downlink subframes in the bundle when the CRC failure is detected, the subsequent downlink subframes being subsequent to the current downlink subframe and prior to an uplink subframe of the bundle,
    to report a single CRC failure for the multiple downlink subframes via the uplink subframe; and
    to decode a retransmission of the bundle beginning at a downlink subframe that previously failed the CRC, the retransmitted bundle being received in response to reporting of the single CRC failure.

13. The apparatus of claim 12, wherein the at least one processor is further configured to decode a downlink subframe subsequent to the current downlink subframe upon detecting that the CRC of the current downlink subframe passed.

14. The apparatus of claim 12, wherein the at least one processor is further configured to report a single CRC pass for the multiple downlink subframes via the uplink subframe upon detecting that the CRC of the current downlink subframe passed and the current downlink subframe is the last downlink subframe of the bundle.

* * * * *